(12) United States Patent
Takahashi

(10) Patent No.: US 7,274,608 B2
(45) Date of Patent: Sep. 25, 2007

(54) SEMICONDUCTOR MEMORY DEVICE AND A METHOD OF REDRESSING A MEMORY CELL

(75) Inventor: Kazuhiko Takahashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 63 days.

(21) Appl. No.: 11/163,732

(22) Filed: Oct. 28, 2005

(65) Prior Publication Data

US 2006/0164908 A1 Jul. 27, 2006

(30) Foreign Application Priority Data

Jan. 25, 2005 (JP) ............................. 2005-016688

(51) Int. Cl.
*G11C 7/00* (2006.01)
(52) U.S. Cl. ...................... 365/200; 365/145; 365/149
(58) Field of Classification Search ................. 365/200
See application file for complete search history.

(56) References Cited

U.S. PATENT DOCUMENTS

| | | | |
|---|---|---|---|
| 5,373,471 A | 12/1994 | Saeki et al. | |
| 5,555,212 A * | 9/1996 | Toshiaki et al. | 365/200 |
| 5,592,428 A * | 1/1997 | Harrand et al. | 365/210 |
| 6,172,921 B1 * | 1/2001 | Park et al. | 365/200 |
| 6,317,355 B1 * | 11/2001 | Kang | 365/145 |
| 6,958,945 B2 * | 10/2005 | Shore | 365/222 |
| 7,016,215 B2 * | 3/2006 | Kamoshida et al. | 365/145 |
| 2004/0114414 A1 * | 6/2004 | Kamoshida et al. | 365/103 |

* cited by examiner

*Primary Examiner*—Son L. Mai
(74) *Attorney, Agent, or Firm*—Volentine & Whitt, PLLC

(57) ABSTRACT

A semiconductor memory device has a non-auxiliary memory cell, an auxiliary memory cell, a first driver, and a second driver. The non-auxiliary memory cell is connected to a predetermined bit line and a first word line. The auxiliary memory cell is connected to the predetermined bit line and a second word line. The first driver operates the first word line. The second driver operates the second word line when the first driver operates the first word line.

10 Claims, 9 Drawing Sheets

SEMICONDUCTOR MEMORY DEVICE AND A METHOD OF REDRESSING A MEMORY CELL

BACKGROUND OF THE INVENTION

1. Field of the Invention

The present invention relates to a semiconductor memory device and a method of redressing a memory cell, which in particular can redress one or more defective memory cells.

2. Background Information

With respect to a conventional semiconductor memory device, in order to rescue memory cells with deficiencies caused by variations in processes and so on, a structure which additionally adopts redundant memory cells for storing data in place of the defective memory cells has been used.

For example, Japanese Laid Open Patent Application No. 5-189996 discloses such semiconductor memory device that adopts redundant memory cells. The semiconductor memory device disclosed by Japanese Laid Open Patent Application No. 5-189996 has memory cells for normal use and redundant memory cells for use in rescue. The memory cells for normal use are disposed in one memory cell region. The redundant memory cells for use in rescue are disposed in another memory cell region. These two memory cell regions are disposed while sandwiching bonding pads between them. In this structure, when there is a defective memory cell among the memory cells in one of the memory cell regions, the semiconductor memory device uses a redundant memory cell in the other memory cell region to work in place of the defective memory cell. Therefore, when data has to be written into the address of the defective memory cell, the semiconductor memory device writes the data into the address of the redundant memory cell instead of the defective memory cell. Likewise, when data has to be read out from the address of the defective memory cell, the semiconductor memory device reads out the data from the redundant memory cell instead of the defective memory cell.

In such conventional semiconductor memory device, a redundant judging circuit for deciding whether the redundant memory cell should be used is provided. In this redundant judging circuit, the address of the defective memory cell is programmed by fuse or such in advance. The redundant judging circuit compares the input address with the programmed address (hereinafter to be referred to as the redundant address), and when the two addresses coincide, it reads out the data from the redundant memory cell or writes the data into the redundant memory cell, whichever is demanded.

However, with respect to such conventional technology, it is necessary to arrange a structure which can selectively acquire from among the data read out from the defective memory cell and the redundant memory cell only the data read out from the defective memory cell. In this respect, it is a problem that the circuit structure or the process to read out data tends to become complicated.

In view of the above, it will be apparent to those skilled in the art from this disclosure that there exists a need for an improved semiconductor memory device and an improved method of redressing a memory cell. This invention addresses this need in the art as well as other needs, which will become apparent to those skilled in the art from this disclosure.

SUMMARY OF THE INVENTION

It is therefore an object of the present invention to resolve the above-described problems, and to provide a semiconductor memory device and a method of redressing memory cells which can redress defective memory cells with less complicated circuit structure and less complicated processes.

In accordance with one aspect of the present invention, a semiconductor memory device has a non-auxiliary memory cell, an auxiliary memory cell, a first driver and a second driver. The non-auxiliary memory cell is connected to a predetermined bit line and a first word line. The auxiliary memory cell is connected to the predetermined bit line and a second word line. The first driver operates the first word line. The second driver operates the second word line when the first driver operates the first word line.

In accordance with another aspect of the present invention, a method of redressing a defective memory cell in a semiconductor memory device comprises the steps of: connecting an auxiliary memory cell and a non-auxiliary memory cell to a predetermined bit line, driving the auxiliary memory cell while driving the non-auxiliary memory cell, and acquiring data output to the predetermined bit line from the auxiliary memory cell and the non-auxiliary memory cell.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Figure 1:
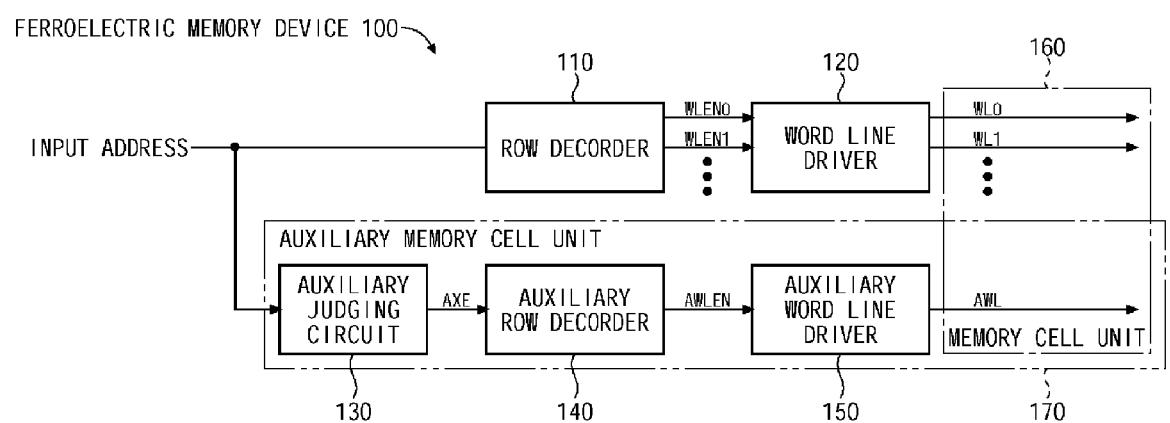
FIG. 1 is a block diagram showing a structure of a ferroelectric memory device according to a first embodiment of the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring now to the drawings, preferred embodiments of the present invention will be described in detail.

(1) First Embodiment

A first embodiment of the present invention will be described with reference to the drawings. In this embodiment, a ferroelectric memory 100 is used as a semiconductor memory device. The ferroelectric memory 100 stores data by using the polarization status of a ferroelectric element formed on a semiconductor substrate.

Structure

FIG. 1 is a block diagram showing a structure of the ferroelectric memory 100. As shown in FIG. 1, the ferroelectric memory 100 has a row decoder (XDEC) 110, a word line driver 120, an auxiliary judging circuit 130, an auxiliary row decoder (AXDEC) 140, an auxiliary word line driver 150 and a memory cell unit 160. The auxiliary judging circuit 130, the auxiliary row decoder 140, the auxiliary word line driver 150 and a part of the memory cell unit 160 (i.e. a structure including an auxiliary selecting transistor AT0 and an auxiliary address 0 shown in FIG. 2) form an auxiliary memory cell unit 170.

In this structure, an address (i.e. an input address) outputted by an external circuit (not shown), such as a CPU (Central Processing Unit) for instance, is received by the row decoder 110 and the auxiliary judging circuit 130. The row decoder 110 decodes the input address. The row decoder 110 also generates word line enable signals WLEN0, WLEN1, . . . which serve to make word lines WL0, WL1, . . . that correspond to the decoded address rise to a predetermined operating potential, and outputs the word line enable signals to the word line driver 120.

The word line driver 120 (first driver) is means for operating the word lines WL. In other words, the word line driver 120 operates the electric potentials of the word lines WL. The word line driver 120 receives the word line enable signals WLEN0, WLEN1, . . . from the row decoder 110 and makes the corresponding word lines WL0, WL1, . . . rise to the predetermined operating potential. In other words, the row decoder 110 and the word line driver 120 operate the corresponding word lines WL0, WL1, . . . based on the input data.

The auxiliary judging circuit 130 (judging circuit) stores in advance one or more addresses of defective memory cells MC (i.e. memory cells which require assistance) which exist in the memory cell unit 160. In the following description, each one of these addresses will be referred to as an auxiliary address. The auxiliary address is programmed inside the auxiliary judging circuit 130 using a fuse, for example. The auxiliary judging circuit 130 compares the input address with the auxiliary address, and when the two addresses coincide, it generates an auxiliary execution enable signal AXE for operating the auxiliary row decoder 140 and outputs the auxiliary execution enable signal AXE to the auxiliary row decoder 140. In this manner, the auxiliary judging circuit 130 stores the auxiliary address indicating the word line WL and compares the stored auxiliary address and the input address inputted from an external circuit.

When the auxiliary execution enable signal AXE is inputted, the auxiliary row decoder 140 generates an auxiliary word line enable signal AWLEN that serves to make an auxiliary word line AWL rise to a predetermined operating potential, and outputs the auxiliary word line enable signal AWLEN to the auxiliary word line driver 150.

The auxiliary word line driver 150 (second driver) is means for operating the auxiliary word line AWL when the word line driver 120 operates one or more word lines WL. In other words, the auxiliary word line driver 150 controls the electric potentials of the auxiliary word line AWL in accordance with need. The auxiliary word line driver 150 receives the auxiliary word line enable signal AWLEN from the auxiliary row decoder 140 and makes the auxiliary word line AWL rise to the predetermined operating potential. In other words, the auxiliary judging circuit 130, the auxiliary row decoder 140 and the auxiliary word line driver 150 operate the auxiliary word line AWL if the input address and the programmed address coincide.

Figure 2:
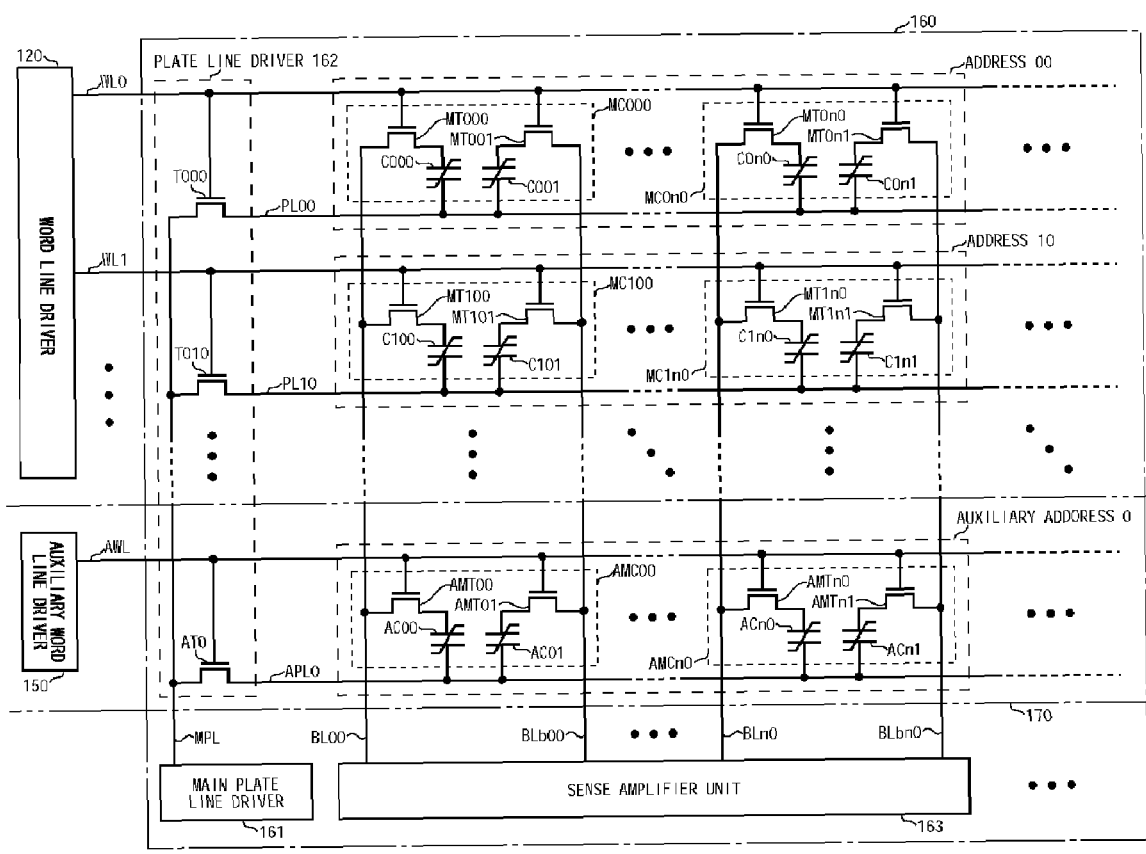
FIG. 2 is a diagram showing a circuit structure and a peripheral structure of a memory cell unit of the ferroelectric memory device according to the first embodiment of the present invention.

Next, the structure of the memory cell unit 160 will be described in detail with reference to FIG. 2. FIG. 2 is a diagram showing a circuit structure and a peripheral structure of the memory cell unit 160.

As shown in FIG. 2, the memory cell unit 160 includes a main plate line driver 161, selective transistors T000, T010, . . . , an auxiliary selective transistor AT0, a sense amplifier unit 163, memory cells MC000 to MC0n0 and MC100 to MC1n0, and auxiliary memory cells AMC00 to AMCn0.

In this structure, for instance, the word line WL0 (first word line), a plate line PL00, and the memory cells MC000 to MC0n0 (non-auxiliary memory cells) connected to these lines constitute a memory region of an address 00. The memory cells MC000 to MC0n0 are connected to a pair of predetermined bit lines BL and BLb, respectively. For example, the memory cell MC000 is connected to bit lines BL00 and BLb00. Likewise, for instance, the word line WL1 (first word line), a plate line PL10, and the memory cells MC100 to MC1n0 (non-auxiliary memory cells) connected to these lines constitute a memory region of an address 10. The memory cells MC100 to MC1n0 are also connected to a pair of predetermined bit lines BL and BLb, respectively. For example, the memory cell MC100 is connected to the bit lines BL00 and BLb00. On the other hand, the auxiliary word line AWL (second word line), an auxiliary plate line APL0, and the auxiliary memory cells AMC00 to AMCn0 (auxiliary memory cells) connected to these lines constitute a memory region of an auxiliary address 0. The auxiliary memory cells AMC00 to AMCn0 are also connected to a pair of predetermined bit lines BL and BLb, respectively. For example, the auxiliary memory cell AMC00 is connected to the bit lines BL00 and BLb00.

The main plate line driver 161 operates the electric potential of a main plate line MPL according to a timing control signal received from an exterior circuit (not shown). That is, upon receiving the timing control signal from the exterior circuit, the main plate line driver 161 makes the main plate line MPL rise to a predetermined operating potential.

A plate line driver 162 including the selective transistors T000, T010, . . . and the auxiliary selective transistor AT0 is provided between the main plate line MPL and each of the plate lines PL00, PL10, . . . and the auxiliary plate line APL0.

The gates of the selective transistors T000, T010, . . . are respectively connected to the word lines WL0, WL1, . . . whose electric potentials are controlled by the word line driver 120. This means that the selective transistors T000, T010, . . . are switched on or off by the word line driver 120. Accordingly, the selective transistors T000, T010, . . . serve to connect the main plate line MPL and the plate lines PL0, PL10, . . . , respectively, according to the control by the word line driver 120.

Likewise, a gate of the auxiliary selective transistor AT0 is connected to the auxiliary word line AWL whose electric potential is controlled by the auxiliary word line driver 150. This means that the auxiliary selective transistor AT0 is switched on or off by the auxiliary word line driver 150. Accordingly, the auxiliary selective transistor AT0 serves to connect the main plate line MPL and the auxiliary plate line APL0 according to the control by the auxiliary word line driver 150.

Each of the memory cells MC000 to MC0n0 and MC100 to MC1n0 shown in FIG. 2 has two selective transistors MT (first transistor or first and second transistors) and two ferroelectric capacitors Cs (first capacitors). In other words, each memory cell MC is a so-called 2T2C type memory which constructs a single piece of data ('H', 'L') by two selective transistors MT and two ferroelectric capacitors Cs. For example, the memory cell MC000 has selective transistors MT000 and MT001, and ferroelectric capacitors C000 and C001. Likewise, the memory cell MC0n0 has selective transistors MT0n0 and MT0n1, and ferroelectric capacitors C0n0 and C0n1. The memory cell MC100 has selective transistors MT100 and MT101, and ferroelectric capacitors C100 and C101. The memory cell MC1n0 has selective transistors MT1n0 and MT1n1, and ferroelectric capacitors C1n0 and C1n1.

The two ferroelectric capacitors Cs of each memory cell MC are potential holding means for storing data. A single memory cell MC stores 1 bit of data as a difference between the electric potentials maintained by the two ferroelectric capacitors Cs. For instance, when the ferroelectric capacitor C000 maintains an electric potential of 'H' level and the ferroelectric capacitor C000 maintains an electric potential of 'L' level, the memory cell MC000 stores 1-bit data of 'H' level. This also applies to the other memory cells MC010 to MC0n0 and MC100 to MC1n0.

The ferroelectric capacitor C of each memory cell MC is connected to a bit line BL via the selective transistor MT. For example, in the memory cell MC000, the ferroelectric capacitor C000 is connected to a bit line BL00 via the selective transistor MT000, and the ferroelectric capacitor C000 is connected to a bit line BLb00 via the selective transistor MT001. This also applies to the other memory cells MC010 to MC0n0 and MC100 to MC1n0.

The gates of the selective transistors MT000 to MT0n1 which belong to the memory cells MC000 to MC0n0 contained in the address 00 are connected to the word line WL0, respectively. Accordingly, the selective transistors MT000 to MT0n1 connect the bit lines BL00 to BLbn0 and the ferroelectric capacitors C000 to C0n1, respectively, according to the operation by the word line driver 120. For example, in the memory cell MC000, the selective transistor MT000 connects the bit line BL00 and the ferroelectric capacitor C000 according to the operation by the word line driver 120, and the selective transistor MT001 connects the bit line BLb00 and the ferroelectric capacitor C001 according to the operation by the word line driver 120. The other memory cells MC010 to MC0n0 and the other addresses 10 have the same structure.

On the other hand, as with the memory cells MC000 to MC0n0 and MC100 to MC1n0, each of the auxiliary memory cells AMC00 to AMCn0 shown in FIG. 2 has two selective transistors AMT (second transistor or third and fourth transistors) (hereinafter to be referred to as auxiliary selective transistors) and two ferroelectric capacitors AC (second capacitor) (hereinafter to be referred to as auxiliary ferroelectric capacitors). In other words, each auxiliary memory cell AMC has a structure equivalent to the 2T2C type memory which constructs a single piece of data ('H', 'L') by two selective transistors MT and two ferroelectric capacitors Cs. For example, the auxiliary memory cell AMC00 has auxiliary selective transistors AMT00 and AMT01, and auxiliary ferroelectric capacitors AC00 and AC01. Likewise, the auxiliary memory cell AMCn0 has auxiliary selective transistors AMTn0 and AMTn1, and auxiliary ferroelectric capacitors ACn0 and ACn1.

As with the memory cell MC, the two auxiliary ferroelectric capacitors AC of each auxiliary memory cell AMC are potential holding means for storing data. A single auxiliary memory cell AMC would store 1 bit of data as a difference between the electric potentials maintained by the two auxiliary ferroelectric capacitors AC. For instance, when the auxiliary ferroelectric capacitor AC00 maintains an electric potential of 'H' level and the auxiliary ferroelectric capacitor AC01 maintains an electric potential of 'L' level, the auxiliary memory cell AMC00 stores 1-bit data of 'H' level. This also applies to the other auxiliary memory cells AMC10 to AMCn0.

The auxiliary ferroelectric capacitor AC of each auxiliary memory cell AMC is connected to the bit line BL via the auxiliary selective transistor AMT. For example, in the auxiliary memory cell AMC00, the auxiliary ferroelectric capacitor AC00 is connected to the bit line BL00 via the auxiliary selective transistor AMT00, and the auxiliary ferroelectric capacitor AC01 is connected to the bit line BLb00 via the auxiliary selective transistor AMT01. This also applies to the other auxiliary memory cells AMC10 to AMCn0.

The gates of the auxiliary selective transistors AMT00 to AMTn1 which belong to the auxiliary memory cells AMC00 to AMCn0 are connected to the auxiliary word line AWL, respectively. Accordingly, the auxiliary selective transistors AMT00 to AMTn1 connect the bit lines BL00 to BLbn0 and the auxiliary ferroelectric capacitors AC00 to Acn1, respectively, according to the operation by the auxiliary word line driver 150. For example, in the auxiliary memory cell AMC00, the auxiliary selective transistor AMT00 connects the bit line BL00 and the auxiliary ferroelectric capacitor AC00 according to the operation by the auxiliary word line driver 150, and the auxiliary selective transistor AMT01 connects the bit line BLb00 and the auxiliary ferroelectric capacitor AC01 according to the operation by the auxiliary word line driver 150. The other auxiliary memory cells AMC10 to AMCn0 have the same structure.

Furthermore, the bit lines BL00 to BLbn0 shown in FIG. 2 are connected to the sense amplifier unit 163. The sense amplifier unit 163 stores the electric potential generated at each of the bit lines BL00 to BLbn0, and outputs it to a digit line (not shown). The electric potential outputted to the digit line, for example, is inputted to a level converter (not shown). The level converter generates 1-bit data from each pair of bit lines BL and outputs the data. For example, the level converter generates 1-bit data according to the difference between the electric potentials generated at bit line BL00 and the bit line BLb00, which make a pair, and outputs the data.

During read out, an electric potential represented by the following formula (1) appears at each of the bit lines BL00 to BLbn0.

$$V_{BL}=Q_C/(C_{BL}+C_C) \quad (1)$$

This electric potential $V_{BL}$ is obtained as a charge $Q_C$, which has been redistributed to and stored in the ferroelectric capacitor C by means of a capacitance $C_{BL}$ of the bit line BL and a capacitance $C_C$ of the ferroelectric capacitor C connected to this bit line BL.

For example, if attention is paid to the bit lines BL00 and BLb00 at the time when the word line WL0 is being driven, an electric potential represented by the following formula (2) appears at the bit line BL00, and an electric potential represented by the following formula (3) appears at the bit line BLb00.

$$V_{BL00}=Q_{C000}/(C_{BL00}+C_{C000}) \quad (2)$$

$$V_{BLb00}=Q_{C001}/(C_{BLb00}+C_{C001}) \quad (3)$$

The electric potential $V_{BL00}$ of the bit line BL00 is obtained as a charge $Q_{C000}$, which has been redistributed to and stored in the ferroelectric capacitor C000 by means of a capacitance $C_{C000}$ of the ferroelectric capacitor C000 and a capacitance $C_{BL00}$ of the bit line BL00.

On the other hand, the electric potential $V_{BLb00}$ of the bit line BLb00 is obtained as a charge $Q_{C001}$, which has been redistributed to and stored in the ferroelectric capacitor C001 by a capacitance $C_{C001}$ of the ferroelectric capacitor C001 and a capacitance $C_{BLb00}$ of the bit line BLb00.

Therefore, a potential difference $\Delta V$ ($=V_{BL00}-V_{BLb00}$) between the electric potential $V_{BL00}$ of the bit line BL00 and the electric potential $V_{BLb00}$ of the bit line BLb00 is to be inputted to the sense amplifier unit 163.

Furthermore, when data is to be read out while a memory cell MC is being redressed by an auxiliary memory cell AMC (i.e., when the memory cell MC and the auxiliary memory cell AMC are being driven at the same time, which is a distinctive operation of the present invention), an electric potential represented by the following formula (4) appears at the bit line BL.

$$Vave_{BL}=(Q_C+Q_{AC})/(C_C+C_{AC}+C_{BL}) \quad (4)$$

This electric potential $Vave_{BL}$ is obtained as a charge $Q_C$ which has been redistributed to and stored in the ferroelectric capacitor C by means of a capacitance $C_{BL}$ of the bit line BL and a capacitance $C_C$ of the ferroelectric capacitor C connected to this bit line BL, and a charge $Q_{AC}$ which has been redistributed to and stored in the auxiliary ferroelectric capacitor AC by means of a capacitance $C_{AC}$ of the auxiliary ferroelectric capacitor AC.

For example, if attention is paid to the bit lines BL00 and BLb00 at the time when the word line WL1 and the auxiliary word line AWL are being driven, the electric potential represented by the following formula (5) appears at the bit line BL00, and the electric potential represented by the following formula (6) appears at the bit line BLb00.

$$Vave_{BL00}=(Q_{C100}+Q_{AC00})/(C_{C100}+C_{AC00}+C_{BL00}) \quad (5)$$

$$Vave_{BLb00}=(Q_{C101}+Q_{AC01})/(C_{C101}+C_{AC01}+C_{BLb00}) \quad (6)$$

The electric potential $Vave_{BL00}$ of the bit line BL00 is obtained as a charge $Q_{C100}$ which has been redistributed to and stored in the ferroelectric capacitor C100 by means of a capacitance $C_{C100}$ of the ferroelectric capacitor C100 and a capacitance $C_{BL00}$ of the bit line BL00, and a charge $Q_{AC00}$ which has been redistributed to and stored in the auxiliary ferroelectric capacitor AC00 by means of a capacitance $C_{AC00}$ of the auxiliary ferroelectric capacitor AC00.

On the other hand, the electric potential $Vave_{BLb00}$ of the bit line BLb00 is obtained as a charge $Q_{C101}$ which has been redistributed to and stored in the ferroelectric capacitor C101 by means of a capacitance $C_{C101}$ of the ferroelectric capacitor C101 and a capacitance $C_{BLb00}$ of the bit line BLb00, and a charge $Q_{AC01}$ which has been redistributed to and stored in the auxiliary ferroelectric capacitor AC01 by means of a capacitance $C_{AC01}$ of the auxiliary ferroelectric capacitor AC01.

Therefore, a potential difference between the electric potential $V_{BL00}$ of the bit line BL00 and the electric potential $V_{BLb00}$ of the bit line BLb00, which is represented by the following formula (7), is to be inputted to the sense amplifier unit 163.

$$\Delta V=Vave_{BL00}-Vave_{BLb00} \quad (7)$$

Principles

Now the particular principles of the present invention that redress a defective memory cell MC using an auxiliary memory cell AMC will be described. In the following description, a situation in which the memory cell MC100 turns out to be defective because both the ferroelectric capacitors C100 and C101 could not obtain a desired area S due to process fluctuations in the manufacturing steps thereof will be considered as an example. However, it should be noted that the present invention is also effective in situations in which a memory cell MC turns out to be defective because the ferroelectric capacitors C could not obtain the desired hysteresis characteristics due to other factors. For instance, one possible factor could be the thickness of the ferroelectric layer. Furthermore, the present invention is also effective in situations in which the memory cell MC100 becomes defective because only one of the ferroelectric capacitors C100 and C101 could not obtain the desired hysteresis characteristics.

In this description, the area S of the ferroelectric capacitor C is the area of a surface which is parallel with an electrode surface of the ferroelectric layer formed between electrodes which construct the ferroelectric capacitor C.

Figure 3A:
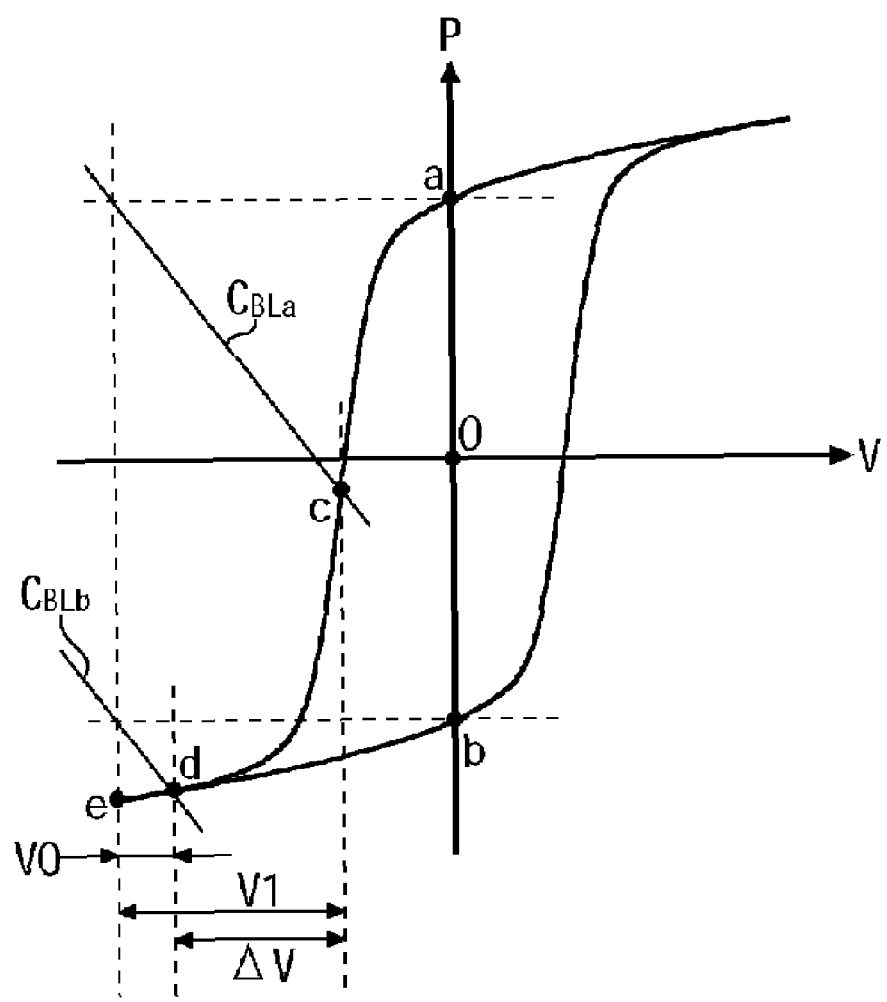
FIG. 3A is a graphical representation showing hysteresis curves of a normal ferroelectric capacitor.
Figure 3B:
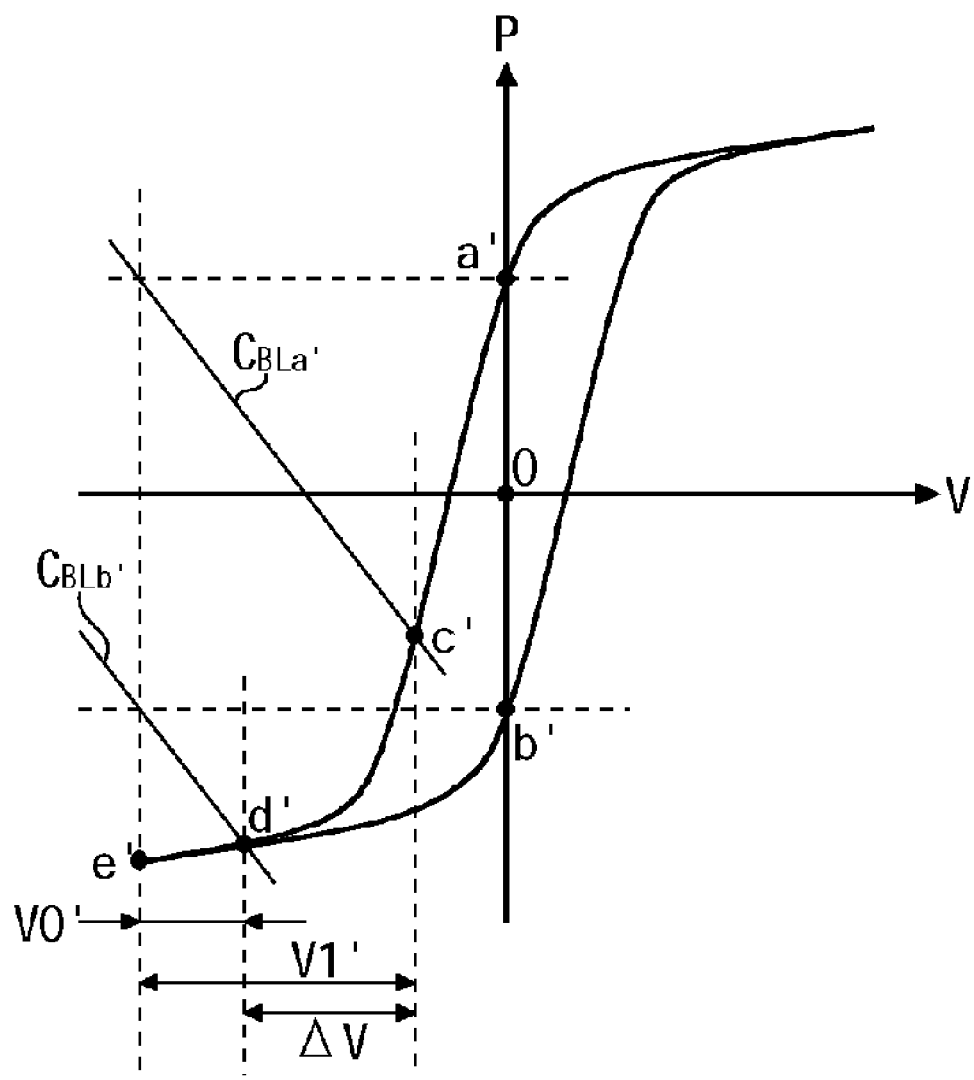
FIG. 3B is a graphical representation showing hysteresis curves of a ferroelectric capacitor in which a desired area could not be obtained.

The polarization status of the ferroelectric capacitor C can be expressed by means of hysteresis curves. FIG. 3A shows hysteresis curves of a normal ferroelectric capacitor C (e.g. the ferroelectric capacitor C000 of the memory cell MC000). FIG. 3B, on the other hand, shows hysteresis curves of a ferroelectric capacitor C which could not obtain the desired area S (e.g. the ferroelectric capacitor C100 of the memory cell MC100). In FIG. 3A and FIG. 3B, the vertical axis represents polarization P ($\mu C/cm^2$) per unit area, and the horizontal axis represents voltage V (V/cm) per unit length. In this description of the embodiment, since the ferroelectric capacitor C001 of the memory cell MC000 is normal, the hysteresis curves would look like the ones shown in FIG. 3A, and because the ferroelectric capacitor C101 of the memory cell MC100 is not able to obtain the desired area S, the hysteresis curves would look like the ones shown in FIG. 3B.

As shown in FIG. 3A, the hysteresis curves of the normal ferroelectric capacitor C000 intersect with the vertical axis at points a and b. Points a and b show residual amounts of polarization of the ferroelectric capacitor C000. That is, in FIG. 3A, the ferroelectric capacitor C000 stores 'H' (high) data under the residual polarization status exhibited by point a, and stores 'L' (low) data under the residual polarization status exhibited by point b. Here, 'H' shows a status in which there is voltage higher than a predetermined value, and 'L' shows a status in which there is no voltage or there is voltage lower than the predetermined value.

In the hysteresis curves shown in FIG. 3A, the interval between point a and point e (provided that the hysteresis curve runs through point c) is an area of inverting response (i.e. inverting response area) of the ferroelectric capacitor C000, and the interval between point b and point e (provided that the hysteresis curve runs through point d) is an area of noninverting response (i.e. noninverting response area) of the ferroelectric capacitor C000. Here, point e is an end point of the inverting response area and the noninverting response area. Furthermore, in FIG. 3A, line $C_{BLa}$ is a line showing a capacitance of the bit line BL00 that corresponds with the residual polarization status exhibited by point a (hereinafter, such capacitance is to be referred to as a bit line capacitance), and line $C_{BLb}$ is a line showing a bit line capacitance that corresponds with the residual polarization status exhibited by point b. Therefore, the potential difference between the electric potential at point e and the electric potential at intersecting point c (q.v. V1 in FIG. 3A) shows a voltage of 'H' level and the potential difference between the electric potential at point e and the electric potential at intersecting point d (q.v. V0 in FIG. 3A) shows a voltage of 'L' level.

Here, for example, if 'H' data is being stored in the memory cell MC000, the ferroelectric capacitor C000 stores 'H' level and the ferroelectric capacitor C001 stores 'L' level. When reading out data from this memory cell MC000, the electric potential of intersecting point c will appear at the bit line BL00 (this electric potential is equivalent to $V_{BL00}$ described above), and the electric potential of intersecting point d will appear at the bit line BLb00 (this electric potential is equivalent to $V_{BLb00}$ described above). Therefore, when reading out 'H' data from the memory cell MC000, the potential difference between the electric potential at intersecting point d and the electric potential at intersecting point c (q.v. ΔV in FIG. 3A) will be inputted to the sense amplifier unit 163.

Furthermore, for example, if 'L' data is being stored in the memory cell MC000, the ferroelectric capacitor C000 stores 'L' level and the ferroelectric capacitor C001 stores 'H' level. When reading out data from this memory cell MC000, the electric potential of intersecting point d will appear at the bit line BL00 (this electric potential is equivalent to $V_{BLb00}$ described above), and the electric potential of intersecting point c will appear at the bit line BLb00 (this electric potential is equivalent to $V_{BL00}$ described above). Therefore, when reading out 'L' data from the memory cell MC000, the potential difference between the electric potential at intersecting point d and the electric potential at intersecting point c (q.v. ΔV in FIG. 3A) will be inputted to the sense amplifier unit 163.

On the other hand, as shown in FIG. 3B, the hysteresis curves of the ferroelectric capacitor C100 which could not obtain the desired area S intersect with the vertical axis at points a' and b'. Points a' and b' show residual amount of polarization of the ferroelectric capacitor C100. That is, in FIG. 3B, the ferroelectric capacitor C100 stores 'H' (high) data under the residual polarization status exhibited by point a', and stores 'L' (low) data under the residual polarization status exhibited by point b'.

In the hysteresis curves shown in FIG. 3B, the interval between point a' and point e' (provided that the hysteresis curve runs through point c') is an inverting response area of the ferroelectric capacitor C100, and the interval between point b' and point e' (provided that the hysteresis curve runs through point d') is a noninverting response area of the ferroelectric capacitor C100. Furthermore, in FIG. 3B, line $C_{BLa}'$ is a line showing a bit line capacitance that corresponds with the residual polarization status exhibited by point a', and line $C_{BLb}'$ is a line showing a bit line capacitance that corresponds with the residual polarization status exhibited by point b'. Therefore, the potential difference between the electric potential at point e' and the electric potential at intersecting point c' (q.v. V1' in FIG. 3B) shows a voltage of 'H' level and the potential difference between the electric potential at point e' and the electric potential at intersecting point d' (q.v. V0' in FIG. 3B) shows a voltage of 'L' level.

Here, for example, if 'H' data is being stored in the memory cell MC100, the ferroelectric capacitor C100 stores 'H' level and the ferroelectric capacitor C101 stores 'L' level. When reading out data from this memory cell MC100, the electric potential of intersecting point c' will appear at the bit line BL00 (this electric potential is equivalent to $V_{BL00}$ described above), and the electric potential of intersecting point d' will appear at the bit line BLb00. Therefore, when reading out 'H' data from the memory cell MC100, the potential difference between the electric potential at intersecting point d' and the electric potential at intersecting point c' (q.v. ΔV in FIG. 3B) will be inputted to the sense amplifier unit 163.

Furthermore, for example, if 'L' data is being stored in the memory cell MC100, the ferroelectric capacitor C100 stores 'L' level and the ferroelectric capacitor C101 stores 'H' level. When reading out data from this memory cell MC100, the electric potential of intersecting point d' will appear at the bit line BL00 (this electric potential is equivalent to $V_{BLb00}$ described above), and the electric potential of intersecting point c' will appear at the bit line BLb00 (this electric potential is equivalent to $V_{BL00}$ described above). Therefore, when reading out 'L' data from the memory cell MC100, the potential difference between the electric potential at intersecting point d' and the electric potential at intersecting point c' (q.v. ΔV in FIG. 3B) will be inputted to the sense amplifier unit 163.

However, when each memory cell MC is a 2T2C type memory cell as in the case of the present invention, the potential difference ΔV that is inputted to the sense amplifier unit 163 when 'H' data or 'L' data is to be read out should be greater than the recognition sensitivity (also known as 'operation margin'). With respect to the hysteresis curves of the normal ferroelectric capacitors C000 and C001 as shown in FIG. 3A, the trajectory difference between the inverting response area (interval a-e) and the noninverting response area (interval b-e) is sufficiently large, and therefore, a sufficient amount of potential difference ΔV (q.v. FIG. 3A) can be acquired. In other words, a potential difference ΔV which is greater than the recognition sensitivity can be acquired.

On the other hand, with respect to the hysteresis curves of the ferroelectric capacitors C100 and C101 which could not obtain the desired area S, the trajectory difference between the inverting response area (interval a'-e') and the noninverting response area (interval b'-e') is comparatively small. This is obvious in comparing FIG. 3B and FIG. 3A. Accordingly, a potential difference ΔV, which is a potential difference between the electric potential at intersecting point d' and the electric potential at intersecting point c', becomes small, and therefore, there is a possibility that this potential difference may not become larger than the recognition sensitivity (q.v. ΔVsa) of the sense amplifier unit 163. In such case, the sense amplifier unit 163 may not be able to discriminate between 'H' level and 'L' level according to the potential difference ΔV generated in the bit line BL00 and the bit line BLb00.

Given this factor, in this embodiment of the present invention, the auxiliary memory cell AMC00 is operated at the same time when operating the memory cell MC which includes the ferroelectric capacitors C100 and C101 which could not obtain the desired hysteresis characteristics. By this arrangement, area S of each of the ferroelectric capacitors C100 and C101 is compensated in appearance by the auxiliary ferroelectric capacitors AC00 and AC01 of the auxiliary memory cell AMC00.

Figure 4:
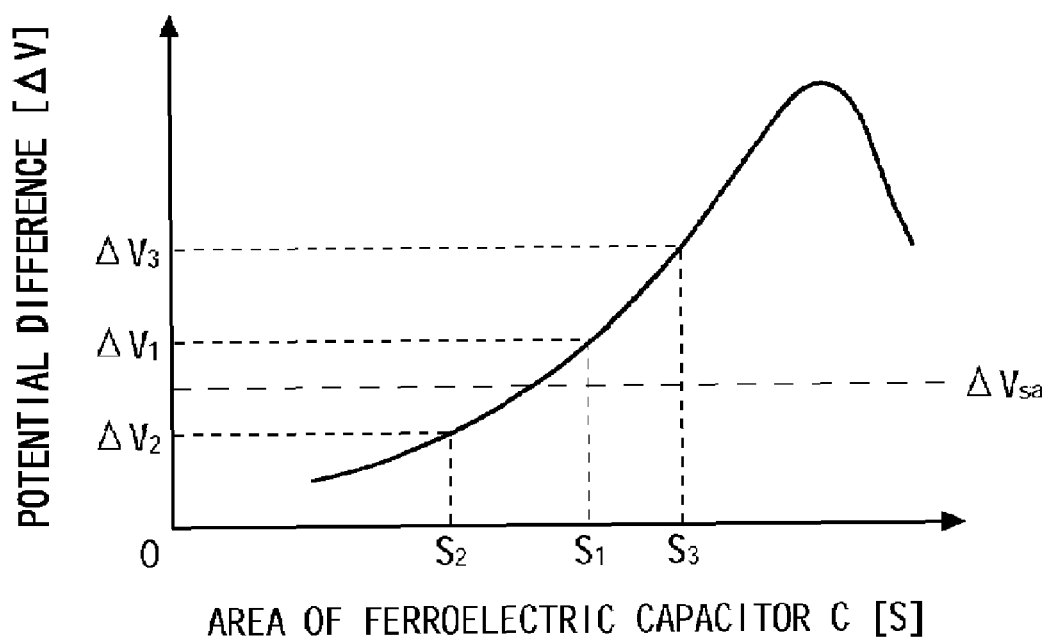
FIG. 4 is a graphical representation showing a relationship between the area of the ferroelectric capacitor and the potential difference $\Delta V$ produced between paired bit lines BL.

Referring now to FIG. 4, a relation between the area S and the potential difference ΔV will be described. As shown in FIG. 4, the potential difference ΔV has a maximum value with respect to the area S of the ferroelectric capacitor. However, with respect to the miniaturized ferroelectric capacitors of the recent trend, the area S is sufficiently smaller than its maximum value with respect to the potential difference ΔV. Accordingly, with this kind of ferroelectric capacitor, the greater the area S becomes, the greater the potential difference ΔV becomes. For instance, assuming that the recognition sensitivity of the sense amplifier unit 163 in FIG. 4 is ΔVsa, the larger the area S gets, the potential difference ΔV larger than ΔVsa can be acquired. This means that a sufficient potential difference ΔV for the detection at the sense amplifier unit 163 can be acquired.

Assuming that the area S of the normal ferroelectric capacitors C000 and C001 is S1, the potential difference ΔV that appears at each of the bit lines BL00 and BLb00 by means of the ferroelectric capacitors C000 and C001 becomes $\Delta V1 (= V_{BL00} - V_{BLb00})$. This figure is larger than the recognition sensitivity ΔVsa, and therefore, the sense amplifier unit 163 is able to detect 'H' data or 'L' data from the bit lines BL00 and BLb00 with accuracy.

On the other hand, assuming that the area S of the ferroelectric capacitors C100 and C101, which could not obtain the desired area S, is S2 (<S1), the potential difference ΔV that appears at each of the bit lines BL00 and BLb00 by the ferroelectric capacitors C100 and C101 becomes ΔV2 (<ΔV1). This figure is smaller than the recognition sensitivity ΔVsa, and therefore, the sense amplifier unit 163 is not able to detect 'H' data or 'L' data from the bit lines BL00 and BLb00

Therefore, in this embodiment of the present invention, as mentioned above, the auxiliary ferroelectric capacitor AC00 is arranged to be connected to the bit line BL00 together with the ferroelectric capacitor C100 which could not obtain the desired hysteresis characteristic (i.e. the desired area S). Likewise, the auxiliary ferroelectric capacitor AC01 is arranged to be connected to the bit line BLb00 together with the ferroelectric capacitor C101 which could not obtain the desired hysteresis characteristic (i.e. the desired area S). By means of these arrangements, the area of the ferroelectric capacitor (C100) connected to the bit line BL00 is enlarged in appearance, for instance, to S3 shown in FIG. 4. Likewise, the area of the ferroelectric capacitor (C101) connected to the bit line BLb00 is enlarged in appearance, for instance, to S3 shown in FIG. 4.

As described above, by compensating the areas S of the ferroelectric capacitors C100 and C101 connected to the bit lines BL00 and BLb00, respectively, the potential difference ΔV that appears between the bit line BL00 and the bit line BLb00 when reading out 'H' data and 'L' data from the memory cell MC100 becomes ΔV3(=VaveBL00−VaveBLb00) which is larger than ΔV2.

In this embodiment of the present invention, for example, the area S of the auxiliary ferroelectric capacitor AC is designed so that the potential difference ΔV3 would become larger than the recognition sensitivity ΔVsa of the sense amplifier unit 163. By this arrangement, even in reading out data from a defective memory cell (MC100), the sense amplifier unit 163 is able to detect 'H' data and 'L' data from the bit lines BL00 and BLb00 with accuracy. Here, considering that the layout continuity with respect to the ferroelectric capacitor C should be maintained, it is desirable that the area S of the auxiliary ferroelectric capacitor AC is set to be equal with the area of the ferroelectric capacitor C. However, the present invention is not limited to such arrangement. It is also possible to provide a design such that the area S of the auxiliary ferroelectric capacitor AC becomes larger than the area S of the ferroelectric capacitor C.

The electric potential that appears at the bit line BL when the ferroelectric capacitor C and the auxiliary ferroelectric capacitor AC are connected at the same time is an electric potential obtained as a charge $(Q_C + Q_{AC})$, which has been redistributed to and stored in the ferroelectric capacitor C and the auxiliary ferroelectric capacitor AC by the capacitance $C_{BL}$ of the bit line BL, the capacitance $C_C$ of the ferroelectric capacitor C and the capacitance $C_{AC}$ of the auxiliary ferroelectric capacitor AC. Therefore, the electric potential Vave$_{BL}$ that appears at the bit line BL is an electric potential obtained as the electric potential $V_{BL} = Q_C/(C_{BL} + C_C)$ appearing at the time when only the ferroelectric capacitor C is connected to the bit line BL, and is compensated by the electric potential $V_{AC} = Q_{AC}/(C_C + C_{AC} + C_{BL})$ by the charge $Q_{AC}$ having been stored in the auxiliary ferroelectric capacitor AC. However, by connecting the auxiliary ferroelectric capacitor AC to the bit line BL together with the ferroelectric capacitor C, the electric potential $V_C$ appearing at the bit line BL only by the charge $Q_C$ having been stored in the ferroelectric capacitor C would be $V_C = Q_C/(C_C + C_{AC} + C_{BL})$. Accordingly, the electric potential Vinc of the bit line BL, which is the amount of electric potential increased by additionally connecting the auxiliary ferroelectric capacitor AC, would be shown in the following formula (8).

$$Vinc = Vave_{BL} - V_{BL} = (Q_{AC}C_C + Q_{AC}C_{BL} - Q_C C_{AC})/(C_C + C_{AC} + C_{BL})(C_C + C_{BL}).$$

In this embodiment, therefore, the area S of the auxiliary ferroelectric capacitor AC is set such that the electric potential Vinc to be compensated by the ferroelectric capacitor AC becomes larger than the predetermined voltage (=2ΔVsa−$V_{BL}$). By this arrangement, the average value Vave$_{BL}$, i.e., ΔV3 shown in FIG. 4, can be made larger than the recognition sensitivity ΔVsa.

For instance, assuming that 'L' level is 0V, the recognition sensitivity ΔVsa is 200 mV, and the electric potential $V_{BL}$ appearing at the bit line BL when only the ferroelectric capacitor C which could not obtain the desired area S is connected is a value within a range of about 100 to 180 mV, the area S of the auxiliary ferroelectric capacitor AC would be designed such that the compensation voltage Vinc would become more than about 20 to 100 mV.

Operation

Next, the operation of the ferroelectric memory 100, especially the operation of each memory cell MC (q.v. FIG. 2) in the memory cell unit 160, according to this embodiment will be described while focusing especially on the operation of reading out from the memory cell MC000 or MC100.

FIG. 5 is a timing chart showing electric potential waves of the word lines WL0 and WL1, the auxiliary word line AWL, the main plate line MPL, and the bit lines BL00 and BLb00.

The operation of reading out from the normal memory cell MC000

The electric potential waves in the operation of reading out 'H' data from the normal memory cell MC000 will be described with reference to FIG. 5A. At this time, the 'H' level is stored in the ferroelectric capacitor C000, and the 'L' level is stored in the ferroelectric capacitor C001.

When the row decoder 110 and the auxiliary judging circuit 130 (q.v. FIG. 2) receive an input address from an external circuit (not shown), the row decoder 110 generates a word line enable signal WLEN0 in order to have the word line WL0 which corresponds with the input address (address 00 in this description) rise up, and outputs the word line enable signal WLEN0 to the word line driver 120.

On the other hand, the auxiliary judging circuit 130 compares the input address with an auxiliary address that it stores in advance. In this description, since the memory cell MC000 is a normal memory cell MC, the auxiliary judging circuit 130 is not storing an auxiliary address that coincides with the input address. Accordingly, the auxiliary judging circuit 130 will not generate an auxiliary execution enable signal AXE. Therefore, an auxiliary word line enable signal AWLEN will not be outputted from the auxiliary row decoder 140, and the auxiliary word line AWL will not rise up.

When the word line enable signal WLEN0 is inputted as mentioned above, the word line driver 120 makes the word line WL0 rise up. In the following description, the timing of such rise will be considered as t1.

Figure 5A:
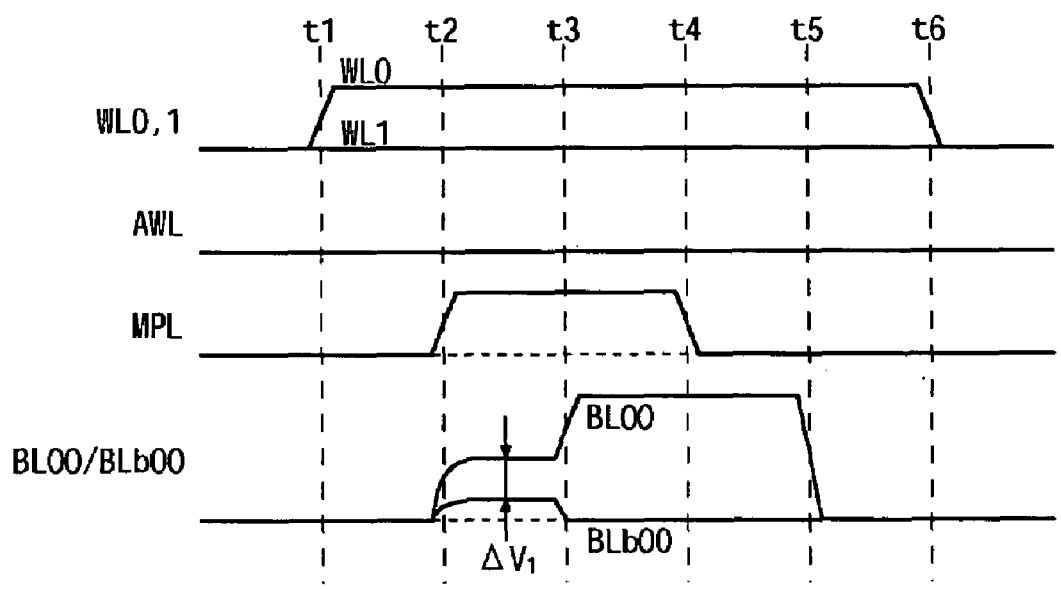
FIG. 5A is a timing chart of potential waves when 'H' data is read out from a normal memory cell MC000.

As shown in FIG. 5A, when the word line WL0 rises up at timing t1, the selective transistors MT000 and MT001 in the memory cell MC000 are switched on and the selective transistor T000 in the plate line driver 162 is switched on. Thereby, the ferroelectric capacitor C000 will be connected to the bit line BL00, the ferroelectric capacitor C001 will be connected to the bit line BLb00, and the main plate line MPL will be connected to the plate line PL00.

Next, when the main plate line MPL rises up at timing t2, the electric charge having been stored in the ferroelectric capacitor C000 is distributed to the bit line BL00, and the electric charge having been stored in the ferroelectric capacitor C001 is distributed to the bit line BLb00. Thereby, an electric difference $\Delta V$ ($=\Delta V1$) appears between the bit line BL00 and the bit line BLb00. In the description of this embodiment, since the area S of the ferroelectric capacitors C000 and C001 is the desired area S1 (q.v. FIG. 3), the potential difference $\Delta V1$ that appears between the bit line BL00 and the bit line BLb00 would have a larger value than the recognition sensitivity $\Delta Vsa$ (q.v. FIG. 3).

Next, when the sense amplifier unit 163 is activated, the electric potential of the bit lines BL00 and BLb00 will be stored in the sense amplifier unit 163. Then the sense amplifier unit 163 detects the electric potential of each of the bit lines BL00 and BLb00 on the basis of the potential difference $\Delta V1$ between the bit lines BL00 and BLb00. Based on this detection, the sense amplifier unit 163 gain-adjusts the electric potentials of the bit lines BL00 and BLb00 to 'H' level or 'L' level, and outputs the results to the digit line (not shown). In the description of this embodiment, the electric potential of the bit line BL00 is gain-adjusted to 'H' level, and the electric potential of the bit line BLb00 is gain-adjusted to 'L' level to be outputted to the digit line.

Next, when the main plate line MPL comes down at timing t4, and the bit lines BL00 and BLb00 are equalized to 0V within the sense amplifier unit 163, 'H' level is re-written into the ferroelectric capacitor C000 while 'L' level is re-written into the ferroelectric capacitor C001 at the same time.

After that, the word line WL0 comes down at timing t6, and the operation of reading out from the memory cell MC000 is brought to completion.

The operation of reading out from the defective memory cell MC100

The electric potential waves in the operation of reading out 'H' data from the defective memory cell MC100 will be described with reference to FIG. 5B. At this time, 'H' level is stored in the ferroelectric capacitor C100, and 'L' level is stored in the ferroelectric capacitor C101.

When the row decoder 110 and the auxiliary judging circuit 130 receive an input address from an external circuit (not shown), the row decoder 110 generates a word line enable signal WLEN1 in order to have the word line WL1 which corresponds with the input address (address 10 in this description) rise up, and outputs the word line enable signal WLEN1 to the word line driver 120.

On the other hand, the auxiliary judging circuit 130 compares the input address with an auxiliary address that it holds in advance. In this description, since the memory cell MC100 is defective, the auxiliary judging circuit 130 is holding an address that coincides with the input address as an auxiliary address. Accordingly, the auxiliary judging circuit 130 will generate an auxiliary execution enable signal AXE and output it to the auxiliary row decoder 140. Upon receiving the auxiliary execution enable signal AXE, the auxiliary row decoder 140 generates an auxiliary word line enable signal AWLEN which causes the auxiliary word line AWL to rise up, and outputs it to the auxiliary word line driver 150.

When the word line enable signal WLEN1 is inputted to the word line driver 120, and the auxiliary word line enable signal AWLEN is inputted to the auxiliary word line driver 150, as just described, the word line driver 120 makes the word line WL1 rise up and the auxiliary word line driver 150 makes the auxiliary word line AWL rise up. In the following description, the timing of such rise will be considered as t1.

Figure 5B:
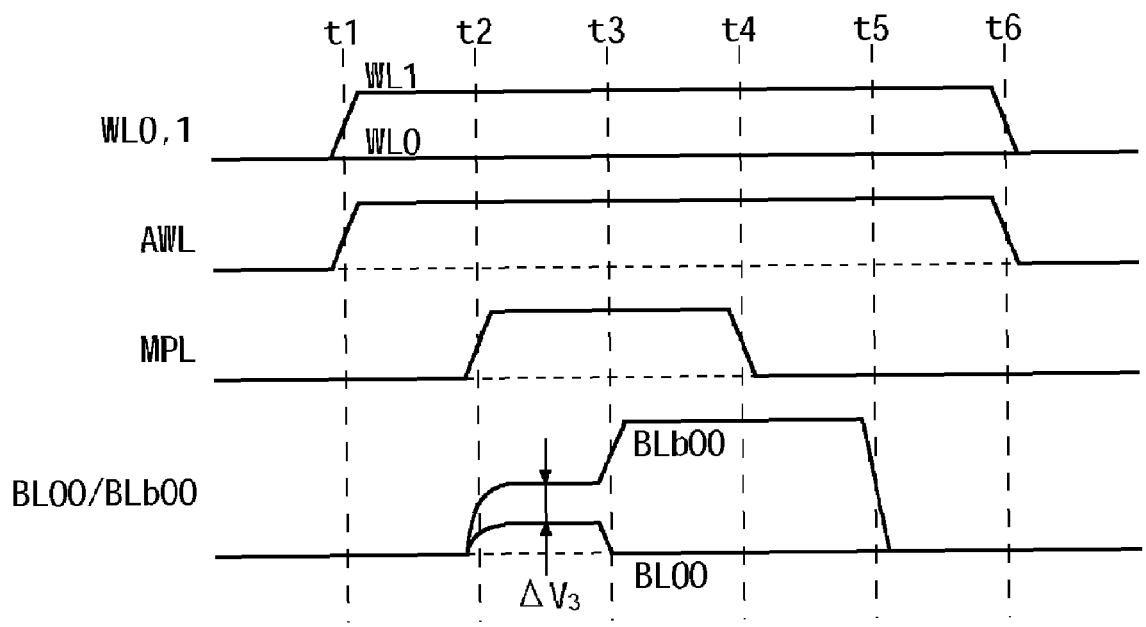
FIG. 5B is a timing chart of potential waves when 'H' data is read out from a defective memory cell MC100.

As shown in FIG. 5B, when the word line WL0 and the auxiliary word line AWL rise up at timing t1, the selective transistors MT100 and MT101 in the memory cell MC100 are switched on, the auxiliary selective transistors AMT00 and AMT01 in the auxiliary memory cell AMC00 are switched on, and the selective transistor T010 and the auxiliary selective transistor AT0 in the plate line driver 162 are switched on. Thereby, the ferroelectric capacitor C100 and the auxiliary ferroelectric capacitor AC00 will be connected to the bit line BL00, the ferroelectric capacitor C101 and the auxiliary ferroelectric capacitor AC01 will be connected to the bit line BLb00, and the main plate line MPL will be connected to the plate line PL10 and the auxiliary plate line APL0.

Next, when the main plate line MPL rises up at timing t2, the electric charge having been stored in the ferroelectric capacitor C100 and the auxiliary ferroelectric capacitor AC00, respectively, are distributed to the bit line BL00, and the electric charge having been stored in the ferroelectric capacitor C101 and the auxiliary ferroelectric capacitor AC01, respectively, are distributed to the bit line BLb00. Thereby, an electric difference $\Delta V$ ($=\Delta V3$) appears between the bit line BL00 and the bit line BLb00. In the description of this embodiment, since an area S which is the sum of the area of the ferroelectric capacitor C100 and the area of the auxiliary ferroelectric capacitor AC00, and an area S which is the sum of the area of the ferroelectric capacitor C101 and the area of the auxiliary ferroelectric capacitor AC010 are both set as S3 (q.v. FIG. 3), the potential difference $\Delta V3$ that appears between the bit line BL00 and the bit line BLb00 would have a larger value than the recognition sensitivity $\Delta Vsa$ (=$Vave_{BL00}$-$Vave_{BLb00}$) (q.v. FIG. 3).

Next, when the sense amplifier unit 163 is activated, the electric potential of the bit lines BL00 and BLb00 will be stored in the sense amplifier unit 163. Then the sense amplifier unit 163 detects the electric potential of each of the bit lines BL00 and BLb00 on the basis of the potential difference $\Delta V3$ between the bit lines BL00 and BLb00. Based on this detection, the sense amplifier unit 163 gain-adjusts the electric potentials of the bit lines BL00 and BLb00 to 'H' level or 'L' level, and outputs the results to the digit line (not shown). In the description of this embodiment, the electric potential of the bit line BL00 is gain-adjusted to 'H' level, and the electric potential of the bit line BLb00 is gain-adjusted to 'L' level to be outputted to the digit line.

Next, when the main plate line MPL comes down at timing t4, and the bit lines BL00 and BLb00 are equalized to 0V within the sense amplifier unit 163, 'H' level is re-written into the ferroelectric capacitor C100 and the auxiliary ferroelectric capacitor AC00 while 'L' level is re-written into the ferroelectric capacitor C101 and the auxiliary ferroelectric capacitor AC01 at the same time.

After that, the word line WL1 comes down at timing t6, and the operation of reading out from the memory cell MC100 and the auxiliary memory cell AMC00 is brought to completion.

As described above, according to this embodiment of the present invention, by having the auxiliary address 0 operate at the same time, a normal reading out operation can be executed with respect to the failed address 10, which is not able to operate appropriately due to the ferroelectric capacitors C100 and C101 being defective.

Effects

As described above, according to this embodiment, when reading/writing is be executed with respect to a certain memory cell MC, which has become defective due to its having ferroelectric capacitors C which are not able to obtain the desired hysteresis characteristics, an auxiliary memory cell AMC having the same structure as the memory cell MC is made to operate. Thereby, the characteristics of the ferroelectric capacitors C which are not able to obtain the desired hysteresis characteristics are compensated by auxiliary ferroelectric capacitors AC of the auxiliary memory cell AMC, and a potential difference ($\Delta V$) which is greater than the operational margin at the sense amplifier unit 163 is generated between a pair of bit lines BL. Therefore, normal operation can be continued, and as a result, the extraction rate of the ferroelectric memory 100 can be improved.

Moreover, since this embodiment has a structure in which both the defective memory cell MC and the auxiliary memory cell AMC are used in operating the electric potential between the bit lines BL, it is not necessary to have a circuit structure or processes for selecting the appropriate data from among the data read out from the defective cell and the data read out from the auxiliary memory cell AMC. As a result, the ferroelectric memory 100 can have a less complicated circuit structure or can operate with less complicated processes.

As described above, the deviation of the hysteresis curve of the ferroelectric capacitor C from the normal value can be caused by the area S of the ferroelectric layer. However, such deviation of the hysteresis curve can also be caused by other factors such as the thickness of the ferroelectric layer, the shape of the capacitor electrode, and so on, for instance. It should be noted that this embodiment can also deal with the situation where the ferroelectric capacitors are not able to obtain the desired hysteresis characteristics due to these and other possible factors.

Furthermore, although the above description of this embodiment is about the ferroelectric memory 100 which stores information by using the polarization status of the ferroelectric element formed on the semiconductor substrate, the present invention is not limited to this. For instance, the present invention can also be implemented using a semiconductor memory device which uses a common electric storage type capacitor.

(2) Second Embodiment

Next, a second embodiment of the present invention will be described in detail with reference to the drawings. In the following, the same reference numbers will be used for the structural elements that are the same with the first embodiment, and redundant explanations of those structural elements will be omitted.

In the conventional art, a redundant memory cell is used instead of a defective memory cell when executing a reading or writing operation with respect to an address of the defective memory cell. The redundant memory cell always operates regardless of whether an operated address corresponds to the defective memory cell or the normal memory cell. Therefore, in the semiconductor memory device of the conventional art, the redundant memory cell always has to be operated even if the process accuracy improved and the number of defective memory cells were reduced or actually disappeared. In other words, the semiconductor memory device of the conventional art is not able to reduce the power consumption regardless of whether a defective memory cell is present or not.

In this embodiment, a ferroelectric memory 200 having a structure which can reduce the power consumption in response to the presence or absence of a defective memory cell is mentioned as an example.

Structure

Figure 6:
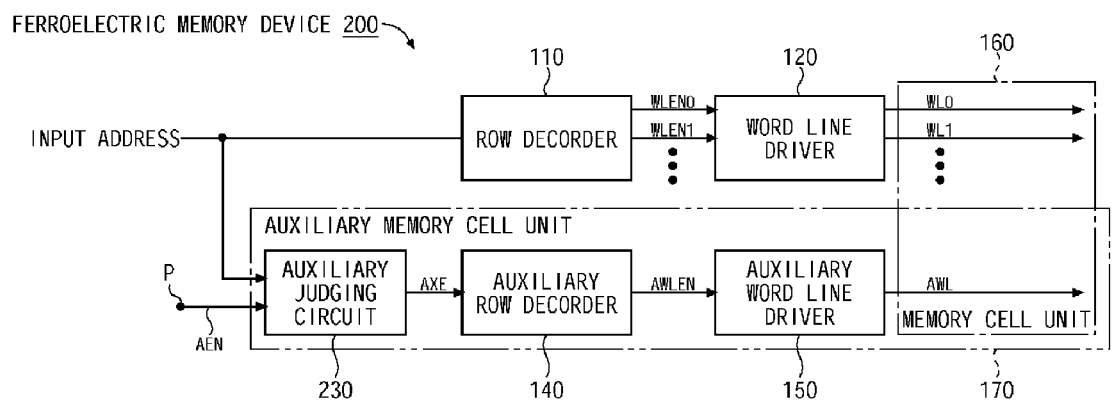
FIG. 6 is a block diagram showing a structure of a ferroelectric memory device according to a second embodiment of the present invention.

FIG. 6 is a block diagram showing a structure of the ferroelectric memory 200. As it is obvious when FIG. 6 is compared with FIG. 1, the ferroelectric memory 200 has the same structure as the ferroelectric memory 100 according to the first embodiment, and the auxiliary judging circuit 130 in the ferroelectric memory 100 is replaced with an auxiliary judging circuit 230.

As with the auxiliary judging circuit 130, the auxiliary judging circuit 230 possesses in advance one or more auxiliary addresses of defective memory cells MC (i.e. memory cells which require assistance) which exist in the memory cell unit 160.

Along with the input address, an auxiliary memory cell unit enable signal AEN (predetermined signal) is also inputted to the auxiliary judging circuit 230. The auxiliary judging circuit 230 compares the input address with the auxiliary address only while the auxiliary memory cell unit enable signal AEN is inputted to the auxiliary judging circuit 230, and when the two addresses coincide, it generates an auxiliary execution enable signal AXE for operating the auxiliary row decoder 140 and outputs the auxiliary execution enable signal AXE to the auxiliary row decoder 140. In other words, the auxiliary judging circuit 230 compares the auxiliary address and the input address if an electric potential of the auxiliary memory cell unit enable signal AEN is at a predetermined level.

In this way, in this embodiment, the auxiliary judging circuit 230 and the circuits located in the subsequent stage of this (i.e. the auxiliary row decoder 140, the auxiliary word line driver 150, and the auxiliary address 0 and so forth) operate only while the auxiliary memory cell unit enable signal AEN is inputted to the auxiliary judging circuit 230. In other words, during this period alone, the auxiliary memory cell unit 170 should operate.

The auxiliary memory cell unit 170 is inactive (i.e. inoperative) while the auxiliary memory cell unit enable signal AEN is not inputted to the auxiliary judging circuit 230. In this period, the auxiliary memory cell unit 170 does not consume electric power. In this manner, in this embodiment, the power consumption of the ferroelectric memory 200 can be reduced regardless of whether the defective memory cell is present or not. For example, considering the case where there is no defective memory cell in the memory cell unit 160, by having a structure where the auxiliary memory cell unit enable signal AEN should not be inputted to the auxiliary judging circuit 230, it is possible to reduce the amount of power consumption of the ferroelectric memory 200 regardless of whether there is a defective memory cell or not.

The auxiliary memory cell unit enable signal AEN is, for instance, generated in the control circuit (e.g. CPU), which is not illustrated, and inputted to the auxiliary judging circuit 230. It is also possible to have the auxiliary memory cell unit enable signal AEN generated in the structure shown in FIG. 7 and inputted to the auxiliary judging circuit 230.

Figure 7:
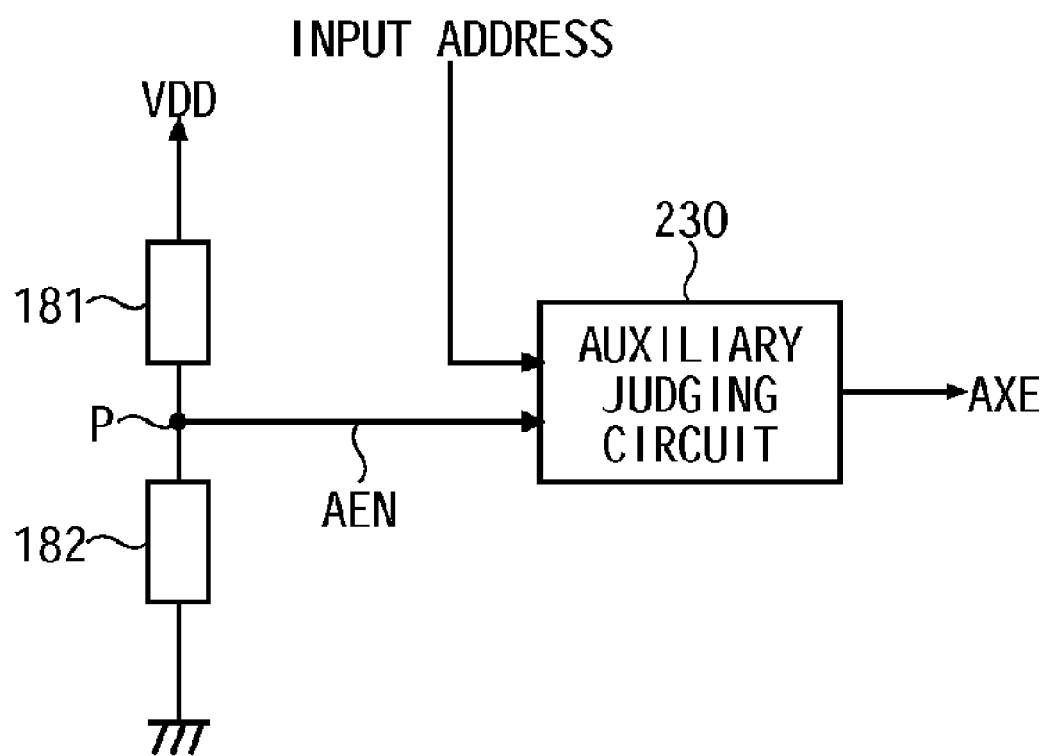
FIG. 7 is a diagram showing a structure for generating an auxiliary memory cell unit enable signal AEN according to the second embodiment of the present invention.

As shown in FIG. 7, the node P shown in FIGS. 6 and 7 is grounded via a fuse 182 while connected to the power supply line to which the power supply voltage VDD is impressed, via a fuse 181. Here, for instance, if there is no defective memory cell MC in the memory cell unit 160, the fuse 181 shown in FIG. 7 is made to break away. In other words, the connection between the power supply line and the node P is electrically cut off. Herewith, the electric potential of the node P is always kept at the ground level (0V), and the auxiliary memory cell unit enable signal AEN should not be inputted to the auxiliary judging circuit 230. As a result, the auxiliary memory cell unit 170 becomes inactive.

On the other hand, for instance, if there is a defective memory cell MC in the memory cell unit 160, the fuse 182 shown in FIG. 7 is made to break away. Herewith, the power supply voltage VDD is impressed to the node P, and the auxiliary memory cell unit enable signal AEN should always be inputted to the auxiliary judging circuit 230. As a result, the auxiliary memory cell unit 170 becomes active, and the auxiliary memory cell AMC is operated if needed.

Operation

Next, the operation of the ferroelectric memory 200 according to this embodiment will be described while focusing especially on the operation for reading out.

The operation when a defective memory cell MC does not exist

First, the operation when a defective memory cell MC does not exist in the memory cell unit 160 will be described. In this operation, the auxiliary memory cell unit enable signal AEN is not inputted to the auxiliary judging circuit 230. In other words, the auxiliary memory cell unit 170 does not operate.

In this state, when the row decoder 110 and the auxiliary judging circuit 230 (q.v. FIG. 6) receive an input address from an external circuit (not shown), the row decoder 110 generates a word line enable signal WLEN0 in order to have the word line WL0 which corresponds with the input address (address 00 in this description) rise up, and outputs the word line enable signal WLEN0 to the word line driver 120.

On the other hand, in this state, the auxiliary judging circuit 230 does not execute a comparison between the input address and the auxiliary address that it stores in advance since the auxiliary memory cell unit enable signal AEN is not inputted to the auxiliary judging unit 230 as mentioned above. Accordingly, the auxiliary word line AWL does not rise up.

When the word line enable signal WLEN0 is inputted as mentioned above, the word line driver 120 makes the word line WL0 rise up. Henceforth, the ferroelectric memory 200 executes the same operation as explained using FIG. 5A in the first embodiment of the present invention, and reads out data from each memory cell MC.

The Operation when a Defective Memory Cell MC Exists

Next, the operation when a defective memory cell MC presents in the memory cell unit 160 will be described. In this operation, the auxiliary memory cell unit enable signal AEN is always inputted to the auxiliary judging circuit 230. In other words, the auxiliary memory cell unit 170 operates.

The Operation of Reading Out from the Normal Memory Cell MC000

In this state, when reading out data from a normal memory cell (to be referred to as MC000 in this description), the row decoder 110 and the auxiliary judging circuit 230 (q.v. FIG. 6) receive an input address from an external circuit (not shown). Upon receiving the input address, the row decoder 110 generates a word line enable signal WLEN0 in order to have the word line WL0 which corresponds with the input address (address 00 in this description) rise up, and outputs the word line enable signal WLEN0 to the word line driver 120.

On the other hand, the auxiliary judging circuit 230 compares the input address with an auxiliary address that it stores in advance. In this description, since the memory cell MC000 is a normal memory cell MC, the auxiliary judging circuit 230 is not holding an auxiliary address that coincides with the input address. Accordingly, the auxiliary judging circuit 230 will not generate an auxiliary execution enable signal AXE. Therefore, an auxiliary word line enable signal AWLEN will not be outputted from the auxiliary row decoder 140, and the auxiliary word line AWL will not rise up.

When the word line enable signal WLEN0 is inputted as mentioned above, the word line driver 120 makes the word line WL0 rise up. Henceforth, the ferroelectric memory 200 executes the same operation as explained using FIG. 5A in the first embodiment of the present invention, and reads out data from each memory cell MC.

The Operation of Reading Out from the Defective Memory Cell MC100

When reading out data from the defective memory cell (to be referred to as MC100 in this description) in a state in which the auxiliary memory cell unit enable signal AEN is inputted to the auxiliary judging unit 230, the row decoder 110 and the auxiliary judging circuit 230 (q.v. FIG. 6) receive an input address from an external circuit (not shown). Upon receiving the input address, the row decoder 110 generates a word line enable signal WLEN0 in order to have the word line WL0 which corresponds with the input address (address 10 in this description) rise up, and outputs the word line enable signal WLEN0 to the word line driver 120.

On the other hand, the auxiliary judging circuit 230 compares the input address with an auxiliary address that it stores in advance. In this description, since the memory cell MC100 is a defective memory cell MC, the auxiliary judging circuit 230 is storing an address that coincides with the input address as an auxiliary address. Accordingly, the auxiliary judging circuit 230 will generate an auxiliary execution enable signal AXE and outputs it to the auxiliary row decoder 140. Upon receiving the auxiliary execution enable signal AXE, the auxiliary row decoder 140 generates an auxiliary word line enable signal AWLEN that makes the auxiliary word line AWL rise up, and outputs it to the auxiliary word line driver 150.

When the word line enable signal WLEN1 is inputted to the word line driver 120, and the auxiliary word line enable signal AWLEN is inputted to the auxiliary word line driver 150, as just described, the word line driver 120 makes the word line WL1 rise up and the auxiliary word line driver 150 makes the auxiliary word line AWL rise up. Henceforth, the ferroelectric memory 200 executes the same operation as explained using FIG. 5B in the first embodiment of the present invention, and reads out data from each memory cell MC.

Effect

As described above, according to this embodiment, the ferroelectric memory 200 has a structure for making the auxiliary memory cell unit 170 active or inactive, in addition to the structure of the ferroelectric memory 100 according to the first embodiment of the present invention. Therefore, in addition to the effect by the first embodiment of the present invention, an effect of this embodiment is that the amount of power consumption of the auxiliary memory cell unit 170 can be reduced depending on the situation. This leads to a reduction of power consumption of the ferroelectric memory 200.

Although an example was cited in this embodiment in which the distinctive structure according to the second embodiment is applied to the ferroelectric memory 100 according to the first embodiment, the present invention is not limited to this factor. For instance, the distinctive structure according to the second embodiment can be applied to a semiconductor memory device having a common capacitor in which electric charge accumulates.

This application claims priority to Japanese Patent Application No. 2005-16688. The entire disclosures of Japanese Patent Application No. 2005-16688 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

What is claimed is:

1. A semiconductor memory device comprising:
   a non-auxiliary memory cell connected to a predetermined bit line and a first word line;
   an auxiliary memory cell connected to the predetermined bit line and a second word line;
   a first driver which operates the first word line;
   a second driver which operates the second word line when the first driver operates the first word line; and
   a judging circuit which stores a first address indicating the first word line, and compares the first address stored in the judging circuit with an second address inputted from an external circuit;
   wherein the second driver operates the second word line if the judging circuit detects coincidence between the first address and the second address;
   a predetermined signal is inputted to the judging circuit from an external circuit; and
   the judging circuit compares the first address and the second address if an electric potential of the predetermined signal is at a predetermined level.

2. The semiconductor memory device according to claim 1, wherein
   the non-auxiliary memory cell has a first capacitor and a first transistor, the first transistor turning on or off a connection between the first capacitor and the predetermined bit line based on an electric potential of the first word line, and
   the auxiliary memory cell has a second capacitor and a second transistor, the second transistor turning on or off a connection between the second capacitor and the predetermined bit line based on an electric potential of the second word line.

3. The semiconductor memory device according to claim 1, further comprising:
   a detecting circuit which detects electric potentials of first and second bit lines and acquires the difference in the electric potentials between the first bit line and the second bit line, the first and second bit lines being the predetermined bit lines;
   wherein the non-auxiliary memory cell has two first capacitors and first and second transistors, the first transistor turning on or off a connection between the first bit line and one of the first capacitors based on an electric potential of the first word line, and the second transistor turning on or off a connection between the second bit line and the other one of the first capacitors based on an electric potential of the first word line; and
   the auxiliary memory cell has two second capacitors and third and fourth transistors, the third transistor turning on or off a connection between the first bit line and one of the second capacitors based on an electric potential of the second word line, and the fourth transistor turning on or off a connection between the second bit line and the other one of the second capacitors based on an electric potential of the second bit line.

4. The semiconductor memory device according to claim 2, wherein the first and second capacitors are ferroelectric capacitors.

5. The semiconductor memory device according to claim 3, wherein the first and second capacitors are ferroelectric capacitors.

6. The semiconductor memory device according to claim 1, wherein
the first driver operates a plurality of word lines, each of which is connected to the non-auxiliary memory cell; and
the first word line is one of the plurality of word lines.

7. A method of redressing a defective memory cell in a semiconductor memory device, comprising the steps of:
connecting an auxiliary memory cell and a non-auxiliary memory cell to a predetermined bit line;
operating the auxiliary memory cell together with the non-auxiliary memory cell;
acquiring data output to the predetermined bit line from the auxiliary memory cell and the non-auxiliary memory cell;
comparing a first address input from an external circuit to a second address programmed in advance by means of a fuse;
operating the auxiliary memory cell together with the non-auxiliary memory cell if the first address and the second address coincide with each other;
detecting an electric potential of a predetermined signal inputted from an external circuit;
comparing the first and second addresses if the electric potential of the predetermined signal is at a predetermined level; and not operating the auxiliary memory cell if the electric potential of the predetermined signal is at the predetermined level.

8. A semiconductor memory device comprising:
a non-auxiliary memory cell connected to a predetermined bit line and a first word line;
an auxiliary memory cell connected to the predetermined bit line and a second word line;
a first driver which operates the first word line;
a second driver which operates the second word line when the first driver operates the first word line; and
a detecting circuit which detects electric potentials of first and second bit lines and acquires the difference between the electric potentials of the first bit line and the second bit line, the first and second bit lines being the predetermined bit lines;
wherein the non-auxiliary memory cell has two first capacitors and first and second transistors, the first transistor turning on or off a connection between the first bit line and one of the first capacitors based on an electric potential of the first word line, and the second transistor turning on or off a connection between the second bit line and the other one of the first capacitors based on an electric potential of the first word line, and
the auxiliary memory cell has two second capacitors and third and fourth transistors, the third transistor turning on or off a connection between the first bit line and one of the second capacitors based on an electric potential of the second word line, and the fourth transistor turning on or off a connection between the second bit line and the other one of the second capacitors based on an electric potential of the second bit line.

9. The semiconductor memory device according to claim 8, further comprising:
a judging circuit which stores a first address indicating the first word line, and compares the first address stored in the judging circuit with an second address inputted from an external circuit;
wherein the second driver operates the second word line if the judging circuit detects coincidence between the first address and the second address.

10. The semiconductor memory device according to claim 8, wherein the first and second capacitors are ferroelectric capacitors.

* * * * *